(12) United States Patent
Alini et al.

(10) Patent No.: US 6,359,503 B1
(45) Date of Patent: Mar. 19, 2002

(54) BASIC CELL FOR PROGRAMMABLE ANALOG TIME-CONTINUOUS FILTER

(75) Inventors: Roberto Alini, Stradella; Francesco Brianti, Piacenza; Valerio Pisati, Bosnasco; Marco Demicheli, Binago, all of (IT)

(73) Assignee: SGS-Thomson Microelectronics, S.R.L., Agrate Brianza (IT)

( * ) Notice: Subject to any disclaimer, the term of this patent is extended or adjusted under 35 U.S.C. 154(b) by 0 days.

(21) Appl. No.: 08/999,962

(22) Filed: Aug. 12, 1997

Related U.S. Application Data

(63) Continuation of application No. 08/604,328, filed on Feb. 21, 1996, now abandoned.
(60) Provisional application No. 60/007,719, filed on Nov. 30, 1995.

(30) Foreign Application Priority Data

Feb. 22, 1995 (EP) .............................. 95830049

(51) Int. Cl.[7] ........................... H03K 5/00; H03H 11/16
(52) U.S. Cl. ...................... 327/552; 327/103; 327/562; 327/563; 327/277; 330/305; 330/252
(58) Field of Search ................................ 327/277, 552, 327/553, 555, 556, 557, 558, 559, 562, 563, 103, 266, 287; 330/305, 306, 252

(56) References Cited

U.S. PATENT DOCUMENTS

| | | | | |
|---|---|---|---|---|
| 4,737,724 A | * | 4/1988 | Porrot | 327/553 |
| 4,771,196 A | * | 9/1988 | Mead et al. | 327/277 |
| 5,051,628 A | * | 9/1991 | Hanna | 327/553 |
| 5,357,208 A | * | 10/1994 | Nelson | 330/306 |
| 5,495,201 A | * | 2/1996 | Alini et al. | 327/563 |
| 6,239,653 B1 | * | 5/2001 | Rezzi et al. | 327/552 |

FOREIGN PATENT DOCUMENTS

| | | |
|---|---|---|
| DE | 3939906 | 6/1991 |
| EP | 0260785 | 3/1988 |

* cited by examiner

*Primary Examiner*—Dinh T. Le
(74) *Attorney, Agent, or Firm*—Jenkens & Gilchrist, P.C.

(57) ABSTRACT

An elementary cell structure for programmable time-continuous analog filters and in particular for the processing of analog signals in read/write operations on magnetic supports comprises an amplifier stage provided with a pair of structurally identical transconductance half-cells connected together in a common circuit node. With a cascade of cells of this type is provided a time-continuous analog delay line which is used in a transverse time-continuous analog filter. This filter comprises a cascade of identical delay lines connected through multiplier nodes to a final summation node. "Elementary cell structure for programmable time-continuous analog filters and in particular for read/write operations on magnetic supports and associated analog filter"

29 Claims, 3 Drawing Sheets

BASIC CELL FOR PROGRAMMABLE ANALOG TIME-CONTINUOUS FILTER

CROSS-REFERENCE TO RELATED APPLICATION

This application is a continuation of application Ser. No. 08/604,328, filed Feb. 21, 1996 and now abandoned.

This application claims priority from Provisional No. 60/007,719 filed Nov. 30, 1995 and EPC App'n 95830049.3, filed Feb. 22, 1995, which is hereby incorporated by reference.

BACKGROUND AND SUMMARY OF THE INVENTION

The present invention relates to an elementary cell structure for programmable time-continuous analog filters and in particular for read/write operations on magnetic supports.

Specifically but not exclusively the present invention relates to a cell comprising an amplifier stage inserted between a first reference supply voltage and a second reference voltage having a first and a second input terminals and an output terminal.

The present invention also relates to a transverse analog filter and a delay chain provided by means of a series of cells of the above type.

As known, in the specific field of application of the present invention there is a need to provide electronic circuits designed for processing analog signals during data read and write phases from and to a magnetic support, e.g. a hard disk of an electronic processor. The signals must be processed in an appropriate manner to avoid data reading and memorization errors.

There is for example a technique known as Partial Response Signaling With Maximum Likelihood Sequence Detection (PRML) which provides only partial sampling of the frequency band of the input signal and the successive search for the highest correspondence possible between the output signal and the input signal sample.

Normally in a PRML architecture an analog signal picked up e.g. by a read/write head of the magnetic support is processed and reconstructed in digital format by means of an equalizing device. Specifically the analog signal is first subjected to an analog equalization by means of a variable-gain input amplifier and successively processed through a time-continuous low-pass analog filter. The majority of analog filters can be manufactured starting from low-pass elementary cells.

The output of the analog filter is successively sampled through an analog/digital converter and further processed through a transverse digital filter, e.g. the Finite Impulse Response (FIR) type which has a transfer function of the following type:

$$y(t) = a_0 + a_1 D^1 + \ldots + a_n D^n \quad (1)$$

where:

$a_0, a_1, \ldots, a_n$ are coefficients chosen according to the type of use of the filter, and $D^1, \ldots, D^n$ is the input signal delayed n times the unit delay.

Normally each of the elementary cells making up a FIR filter has a transfer function to supply at the output the input signal delayed according to a predetermined value, called unit delay.

The delay with which the input signal appears at the output is a function of the signal frequency. More specifically the delay is the derivative in relation to the frequency with changed sign of the transfer function phase between the input and the output.

The prior art proposes to provide the FIR filters in a digital or sampled time manner. These solutions are however affected by an error due to the quantization of the analog signal which must be converted into a digital signal and by another error introduced by the sampling of the signal and commonly called "aliasing" phenomenon.

The presence of these errors limits the use of digital or sampled time FIR filters in many applications as for example those for magnetic support read/write devices.

The technical problem underlying the present invention is to conceive an elementary cell structure of the analog type to provide time-continuous filters having structural and functional characteristics allowing replacing digital filters which still limit the use of the PRML technique in read/write devices provided in accordance with the prior art.

Another purpose of the present invention is to conceive a delay line achieved with a chain of elementary cells allowing introduction in the filtering phase of a delay of any predetermined value without thereby distorting the input signal either in phase or in amplitude.

The solution idea underlying the present invention is to provide a symmetrical structure of the time-continuous analog type comprising two identical half-cells provided starting from a transconductance amplifier stage.

The problem is solved by a transverse analog filter comprising a plurality of elementary cells in accordance with claim 1 and following.

The characteristics and advantages of the present invention are set forth in the description of an embodiment thereof given below by way of non-limiting example with reference to the annexed drawings.

BRIEF DESCRIPTION OF THE DRAWING

The disclosed inventions will be described with reference to the accompanying drawings, which show important sample embodiments of the invention and which are incorporated in the specification hereof by reference, wherein.

In the drawings.

DETAILED DESCRIPTION OF THE PREFERRED EMBODIMENTS

Figure 1:
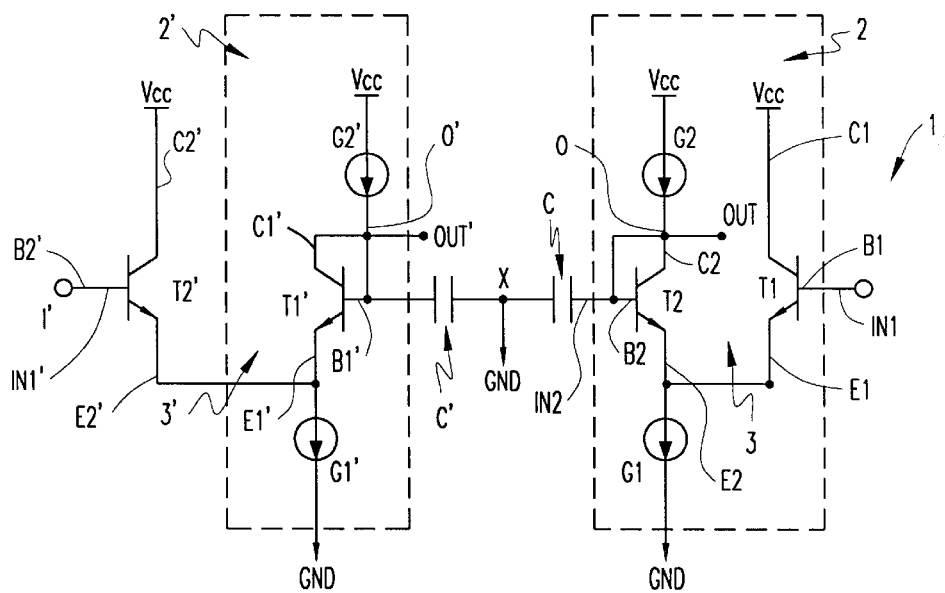
FIG. 1 shows schematically an elementary low-pass analog cell in accordance with the present invention.

The numerous innovative teachings of the present application will be described with particular reference to the presently preferred embodiment (by way of example, and not of limitation), in which:

With particular reference FIG. 1 reference number 1 indicates as a whole and schematically an elementary analog cell structure provided in accordance with the present invention.

This structure is designed in particular but not exclusively for the manufacture of programmable time-continuous analog filters for read/write operations on magnetic supports.

The cell 1 comprises essentially two identical half-cells 2 and 2' inserted between a first reference supply voltage Vcc and a second reference voltage, e.g. a signal ground GND.

The first half-cell 2 comprises a transconductance amplifier stage 3 with an input terminal IN1 and an output terminal OUT.

The amplifier stage 3 comprises a pair of transistors T1 and T2 having their emitter terminals E1 and E2 respectively connected together and, through a bias current generator G1, to the second reference voltage GND.

The transistors T1 and T2 are, in the preferred embodiment shown here in FIG. 1, type NPN BJT bipolar transistors. The cell 1 in accordance with the present invention could also be provided by means of type PNP bipolar transistors or by means of field effect MOS transistors either of the NMOS or the PMOS type.

The transistor T1 has its collector terminal C1 connected to the reference supply voltage Vcc while the base terminal B1 of the same transistor T1 coincides with the input terminal IN1 of the amplifier stage 3.

The transistor T2 has its base terminal B2 and collector terminal C2 short-circuited together in an essentially diode configuration. The collector terminal C2 coincides with the output terminal OUT of the amplifier stage 3 and is connected to the reference supply voltage Vcc by means of a second generator G2 of bias current Ib. Advantageously in accordance with the present invention the first generator G1 delivers a bias current 2*Ib double that delivered by the second generator G2.

The base—or control—terminal B2 of the transistor T2 is connected to a circuit node X for connection between the two half-cells 2 and 2' through a capacitor C.

The circuit node X can be connected to the second reference voltage GND or can be floating.

The structure of the second half-cell 2° is fully identical to and symmetrical with that of the first half-cell 2 described above. Therefore, for the sake of simplicity, a detailed description thereof is omitted only noting that all the elements corresponding to those of the first cell 2 are indicated in the figures with the same reference numbers and symbols but with the addition of a superscript.

As mentioned above, the first half-cell 2 and the second half-cell 2' are connected together in the circuit node X.

The input terminal IN1 of the amplifier stage 3 of the first half-cell 2 coincides with the first input terminal I of the cell 1 as a whole while the input terminal IN1' of the amplifier stage 3' of the second half-cell 2' coincides with the second input terminal I' of the cell 1.

The output terminals OUT and OUT' of the amplifier stages 3 and 3' are the output terminals 0 and 0' of the cell 1.

The cell 1 of FIG. 1 is illustrated in a fully differential configuration which has better rejection to common mode signals and noise from the power supply. For the cell 1 it is also alternatively possible to provide a single-ended configuration.

In any case an elementary low-pass cell is a circuit structure capable of providing a transfer function between its input and output terminals since it has essentially a single dominant pole at high frequencies.

The transfer function FdT of the cell 1 in accordance with the present invention is as follows:

$$FdT = V_{out}/V_{in} = (1+s*\tau_c)^{-1} * (1+s*\tau_{par})^{-1} \quad (2)$$

where:

$V_{in}$ is the input signal of the cell 1, $V_{out}$ is the output signal of the cell 1, $\tau_c$ is the time—or delay—constant linked to the dominant pole of the cell 1 and is equal to 2*Cout/gm where Cout is the equivalent output capacitance and gm is the transconductance of the cell 1, $\tau_{par}$ is the time—or delay—constant due to the presence of a parasitic pole and is equal to 2*Cpar/gm where Cpar is the equivalent parasitic capacitance of the cell 1.

In practical applications it is permissible to ignore the effect of this parasitic pole which has a much higher frequency than the dominant pole. The transfer function can be simplified as follows:

$$FdT = V_{out}/V_{in}(\omega) = (1+s*\tau_c)^{-1} \quad (3)$$

Recalling that the delay with which the input signal Vin appears at the output is, depending on the frequency, the derivative of the transfer function FdT with the sign changed, for the cell 1 we have:

$$R(\omega) = \tau_c * (1+s*\tau_c)^{-1} \quad (4)$$

where R(w) is the delay of the output signal as a function of the angular frequency. For input signals Vin having maximum frequencies in the frequency spectrum lower than the cut-off frequencies of the cell 1, cut-off frequency which is equal to c=1/$\tau_c$ of formula (3), the output signal Vout from the cell 1 is distorted neither in phase nor in amplitude but only delayed by a time interval equal to $\tau_c$.

Thus was obtained a circuit structure having the great advantage of being able to delay the input signal in accordance with a predetermined delay value $\tau_c$, but without introducing any distortion.

The cell 1 can thus be considered as a constant delay element $\tau_c$, also equal to ½*π*$f_c$, where $f_c$ is the cut-off frequency of the cell 1. This delay $\tau_c$ is however linked to the band of frequencies of the input signal Vin, which must not have any component in frequency greater than fc/10 to not have distortion of the output signal Vout.

This constraint in reality limits the possible delay for processing of a given input signal Vin at the value 10*2*π*$f_{maxi}$, where $f_{maxi}$ is the maximum frequency of the band of the input signal Vin. To obviate this shortcoming it is possible to provided a delay line LR by means of a cascade of cells 1. Specifically, it is sufficient to connect in parallel the outputs OUT and OUT' of a cell with the inputs I, I' of another cell to obtain a delay line LR consisting of two base cells. It is clear that the base structure can be repeated depending on necessities by connecting in cascade together a number n of cells 1.

The resulting line LR has a delay equal to n*$\tau_c$, i.e. a cut-off frequency fc equal to n*$f_{maxi}$, where n is the number of cells 1 cascaded.

To eliminate all noise from the output signal it is appropriate to provide a delay line LR by cascading ten cells 1. In this manner the frequency limit $f_c$/10 imposed by the delay line LR would be identical to the highest frequency value contained in the input signal Vin.

In practice the connection in cascade of only five cells 1 is acceptable so as to gain in terms of dispersed power.

In reality a delay line LR consisting of the cascade of n cells 1 of the low-pass type all having the same cut-off frequency fc exhibits a final cut-off frequency F at the output of the chain (at the −3 dB point) approximately equal to:

$$F = f_c/\sqrt{n} \quad (5)$$

The delay line LR complies with the requirement for having a relatively flat delay but can introduce elements which are not ideal as concerns the frequency response of the output signal. The line LR attenuates the high frequency components of the input signal Vin.

This apparently negative feature does not really represent a true problem when the delay line LR is used for providing recursive filters such as for example transverse filters FIR.

Figure 2:
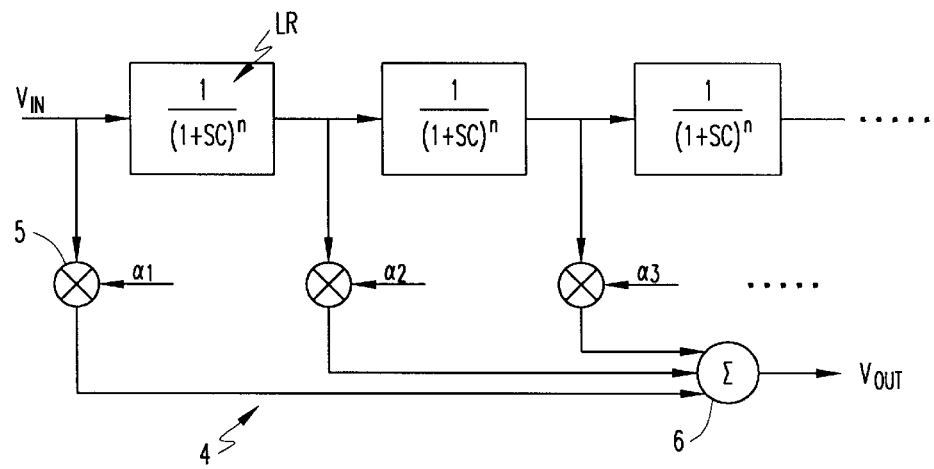
FIG. 2 shows schematically a first example of a transverse analog filter provided in accordance with the present invention.

A first example of a FIR transverse filter 4 is shown schematically in FIG. 2.

The filter 4 comprises a cascade of identical delay lines LR connected through multiplier nodes 5 to a final summation node 6.

The signal Vo output by the node 6 is obtained by means of a transfer function determined from formula (1) with a unitary delay equal to the delay of the line LR.

Figure 3:
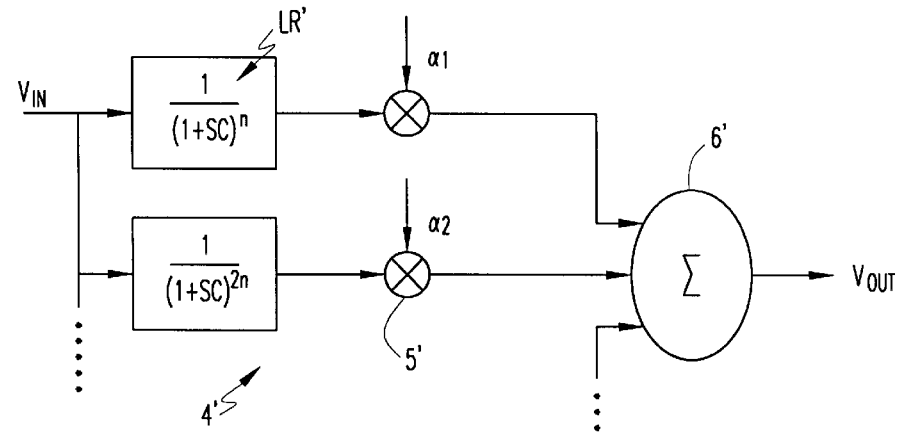
FIG. 3 shows schematically a second example of a transverse analog filter provided in accordance with the present invention.

The coefficients $a_1, \ldots, a_n$ are input at the multiplier nodes 5. FIG. 3 shows schematically a second possible embodiment of a filter 4' of the transverse FIR type.

The filter 4' comprises an summation node 6' to which lead a plurality of delay lines LR' each of which is connected to the summation node 6' through a multiplier node 5'.

Each of the n delay lines LR' supplies at output a signal delayed n times which is multiplied in each of the nodes 5' by the relative coefficient $a_1, \ldots, a_n$ in such a manner as to obtain a transfer function in accordance with formula (1).

In both the filter examples 4 and 4' the same signal delayed in time is added after being multiplied by appropriate coefficients. Then the final result is an output signal having the desired phase and amplitude characteristics and this allows overcoming the typical limitations of the delay lines LR provided by a simple cascade of cells 1.

Figure 4:
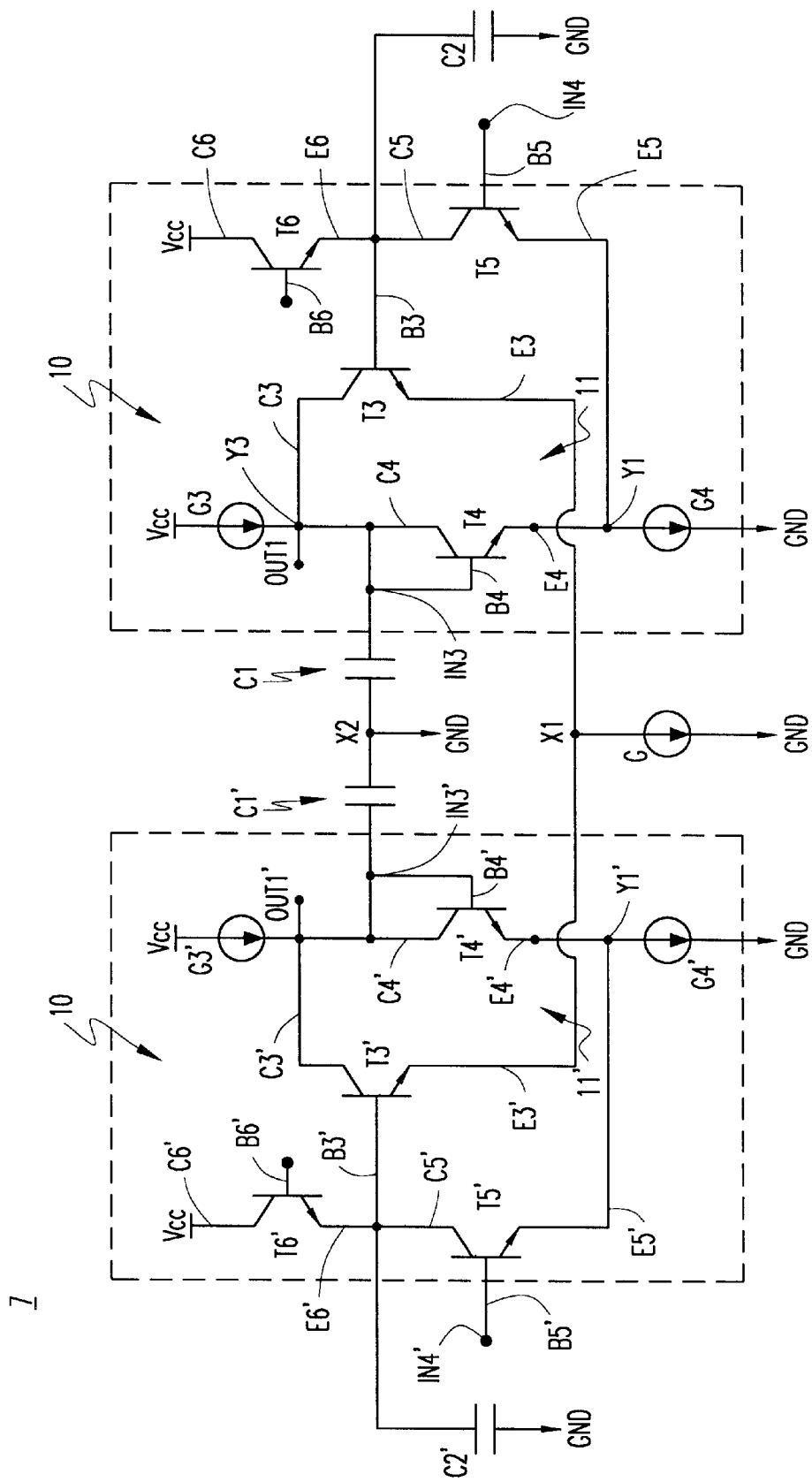
FIG. 4 shows two circuit portions of another embodiment of the elementary analog cell in accordance with the present invention.

In FIG. 4 is proposed a second embodiment of an elementary analog cell 7 in accordance with the present invention.

The cell 7 comprises an input stage 8 and an output stage 9. The structure of the output stage 9 is shown schematically in FIG. 5.

The input stage 8 comprises two identical input half-stages 10 and 10' inserted between a first reference supply voltage Vcc and a second reference voltage, e.g. a signal ground GND.

The first input half-stage 10 comprises a transconductance amplifier stage 11, an input terminal IN4 and an intermediate output terminal OUT1.

The transconductance amplifier stage 11 comprises a pair of transistors T4 and T5 whose emitter terminals E4 and E5 are connected together to form a first circuit node Y1.

The circuit node Y1 is connected to the second reference voltage GND through a second bias current generator G4 while the base terminal B5 of the transistor T5 coincides with the input terminal IN4 of the half-stage 10.

The transistor T4 has its base terminal B4 and collector terminal C4 short-circuited together and to a circuit node Y3. The collector C4 coincides with the intermediate output terminal OUT1 of the input half-stage 10.

The circuit node Y3 is connected through a first generator G3 of bias current 2*Ib to the reference supply voltage Vcc.

Advantageously in accordance with the present invention the second generator G4 delivers a bias current 2*Ib identical to that delivered by the first generator G3.

There is provided a third transistor T3 having its own base terminal B3 connected to the collector C5 of the transistor T5 and the emitter terminal E3 connected to a first circuit node X1 common to the two half-stages 10 and 10'.

The common circuit node X1 is connected to the second reference voltage GND through a common generator G of bias current 2*Ib. The value of this generator G is equal to that of the generators G3 and G4.

The terminal OUT1 is connected to a second circuit node X2 common to the two half-stages 10 and 11 through a first capacitor C1. The common circuit node X2 is also connected to the second reference voltage GND or may remain floating.

The input half-stage 10 comprises additionally a bias transistor T6 inserted between the first reference supply voltage Vcc and the collector C5 of the transistor T5. This collector C5 is advantageously connected to the second reference voltage GND through a second capacitor C2.

On the base terminal B6 of the transistor T6 is applied a bias voltage Vb2.

The structure of the second half-stage 11 is fully identical to and symmetrical with that of the first half-stage 10 described above. Therefore, for the sake of brevity, a detailed description thereof is omitted with the note that all the elements corresponding to those of the first half-stage 10 are indicated in FIG. 4 by the same reference numbers and symbols but with the addition of a superscript.

It is only remarked that the input half-stage 10 and the input half-stage 10' are connected together in the first common circuit node X1 and the second common circuit node X2.

Figure 5:
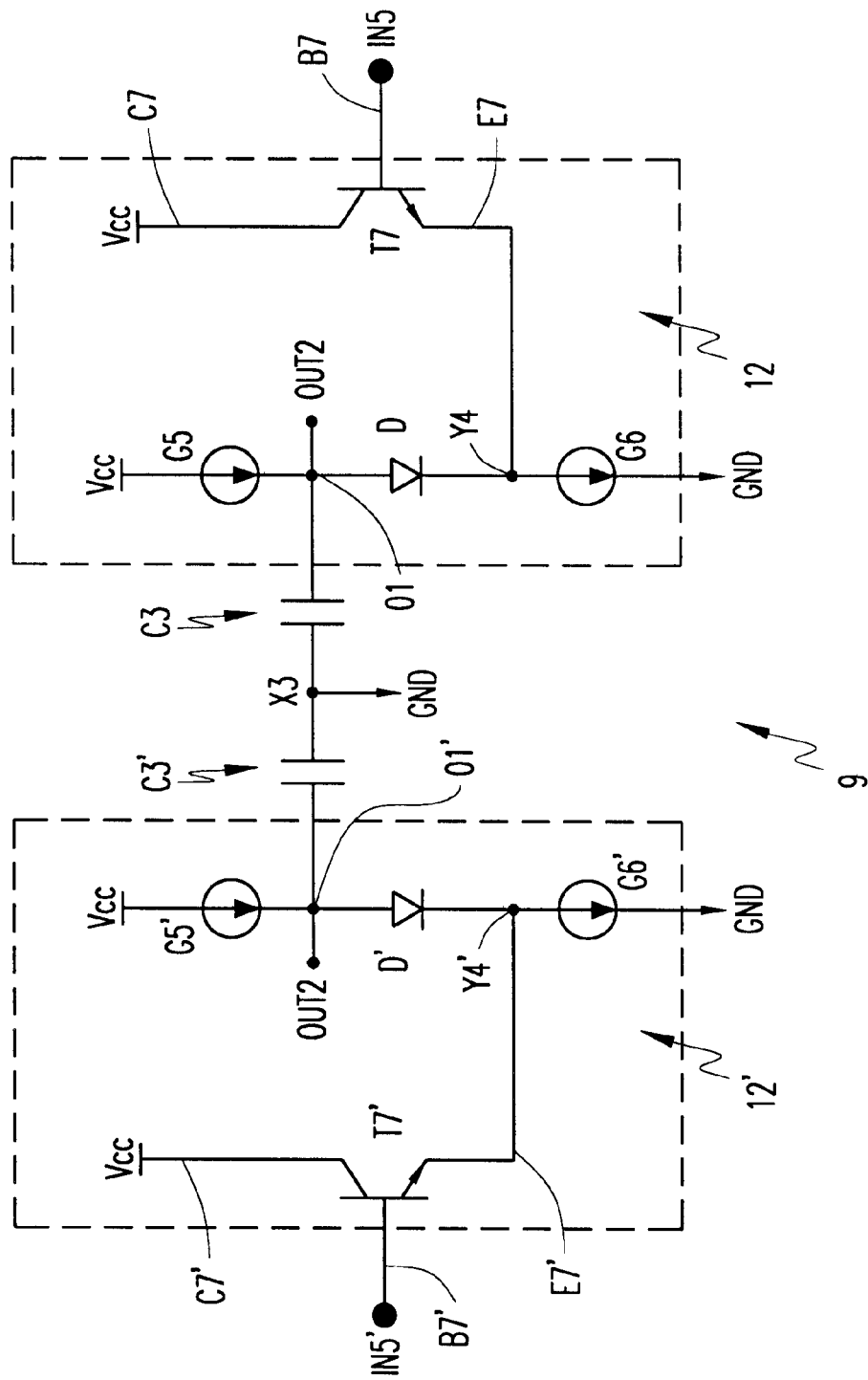
FIG. 5 shows a different representation of the circuit structure of FIG. 1.

Now with particular reference to the example of FIG. 5 there is described the structure of the output stage 9 of the cell 7. Operation of the input stage 8 and the output stage 9 is described below.

The output stage 9 has two intermediate input terminals IN5 and IN5' and two final output terminals OUT2 and OUT2'.

The intermediate output terminals OUT1 and OUT1' of the input stage 8 are connected to the intermediate input terminals IN5 and IN5' of the output stage 9.

The output stage 9 comprises two identical output half-stages 12 and 12' inserted between the first reference supply voltage Vcc and the second reference voltage GND.

The half-stage 12 comprises a transistor T7 having its base—or control—terminal B7 coinciding with the input IN5. The collector terminal C7 of the transistor T7 is connected to the first reference supply voltage Vcc. The emitter terminal E7 of the transistor T7 is connected towards the second reference voltage GND through a bias current generator G6.

The half-stage 12 comprises in addition a diode D inserted between the final output terminal OUT2 and the emitter E7.

The final output terminal OUT2 is also connected to the first reference voltage Vcc through a generator G5 of bias current 2*Ib. Advantageously the generator G5 delivers a bias current 2*Ib equal to that delivered by the first generator G3 and the second generator G4 and by the common generator G.

The generator G6 delivers a bias current 4*Ib which is double than the bias current delivered by the generator G5.

The final output terminal OUT2 is connected at a common circuit node X3 to the two half-stages 12 and 12' through a capacitor C3. The node X3 is connected to the second reference voltage GND.

The structure of the second half-stage 12' is fully identical to and symmetrical with that of the first half-stage 12 described above. Therefore a detailed description thereof is omitted with the only notice that all the elements corresponding to those of the first half-stage 12 are indicated in FIG. 5 by the same reference numbers and symbols but with the addition of a superscript.

A parallel can be drawn between the structure of the cell 7 as a whole as shown in FIGS. 4 and 5 and the structure of the more compact cell 1 of FIG. 1 considering that the input terminal IN4 of the half-stage 10 corresponds to the first input terminal I of the cell 1 while the second input terminal IN4' of the half-stage 10' corresponds to the second input terminal I' of the cell 1.

Similarly, the final output terminals OUT2 and OUT2' of the output stage 9 correspond to the output terminals OUT and OUT' of the cell 1.

Operation of this second embodiment of the structure of the cell in accordance with the present invention is now discussed.

The transfer function FdT1 of the input stage 8 of the cell 7 is as follows:

$$FdT1=V_{out1}/V_{in}=(1+s*\tau'_c/2)*(1+s*1.5\tau'_c+s^2\tau'_c)^{-1} \quad (6)$$

while the transfer function FdT2 of the output stage 9 of the cell 7 is as follows:

$$FdT2=V_{out2}/V_{out1}=1*(1+s*\tau'_c)^{-1} \quad (7)$$

where:

$V_{out1}$ is the intermediate output signal of the input stage 8; the one on the outputs OUT1 and OUT1'

$V_{out2}$ is the final output signal of the cell 7;

$V_{in}$ is the input signal of the cell 7;

$\tau'_c$ is the time constant or delay linked to the dominant pole of the cell 7 and is equal to $2*C'_{out}/g'_m$, where $C'_{out}$ is the equivalent output capacitance and $g'_m$ is the transconductance of the cell 7.

There is thus obtained the overall transfer function FdT' of the cell 7 equal to:

$$FdT'=V_{OUT2}/V_{in}=(1+s*\tau'_c/2)*(1+s*1.5\tau'_c+s^2\tau'_c)^{-1}*(1(1+s*\tau'_c) \quad (8)$$

The transfer function FdT' given by formula (8) exhibits a zero on the left which permits partial compensation of the phase effect introduced by the left-hand poles.

The effect of a zero on the left is to delete a pole on the left.

This zero therefore does not increase the delay of the cell 7. Indeed, as may be deduced from formula (8), recalling that the delay with which the input signal Vin appears at the output is a function of the frequency and in particular is the derivative of the transfer function FdT' with changed sign, the delay of the cell 7 with frequency null is equal to:

$$R(\omega)|_{\omega=0}=2*\tau'_c \quad (9)$$

However, the presence of the zero on the left reduces the phase distortion making it negligible up to frequencies equal to $f_c$ (where the distortion is less than 1%) where $f_c$ is the cut-off frequency of the cell 7 equal to $1/(2*\pi*\tau_c)$.

There is thus obtained greater linearity in the group delay transfer characteristic for a cascade of cells 7 allowing using input signals with the highest frequency content $f_{maxi}$ which reaches $f_c$.

Using a plurality of cells 7 it is possible to provide delay lines LR and transverse filters in a manner quite similar to that described in relation to the analog cell 1.

To the cells, to the delay lines and to the filters in accordance with the present invention there can be made modifications and variations in a manner apparent for one of ordinary skill in the art without however going beyond the protective scope of the present application.

For example, the cell 7 of FIGS. 4 and 5 is illustrated in a configuration of the fully differential type offering better rejection to common mode signals and noise from the power supply. For this cell 7 it is also possible to provide a "single ended" type configuration.

Furthermore, the transistors T3, T4, T5, T6 and T7 are described as type NPN BJT bipolar transistors. The cell 7 in accordance with the present invention could however be provided by means of type PNP BJT bipolar transistors or field effect MOS transistors of either the NMOS type or the PMOS type.

According to one disclosed class of innovative embodiments, there is provided an elementary cell structure for programmable time-continuous analog filters and in particular for the processing of analog signals in read/write operations on magnetic supports of the type including an amplifier stage inserted between a first reference supply voltage and a second reference voltage and having at least one input terminal and at least one output terminal and characterized in that said amplifier stage comprises a pair of structurally identical half-cells with each provided with a transconductance amplifier stage and connected to the other half-cell through a common circuit node.

There is also disclosed a time-continuous analog delay line comprising a cascade of cells as described above.

There is also disclosed a transverse time-continuous analog filter comprising at least one delay line as described above.

There is also disclosed a time-continuous integrated circuit filter structure, comprising a plurality of transconductor delay stages which are all topologically similar to each other and which each include at least one capacitor; a plurality of analog multiplying stages each connected to the output of a respective one of said transconductor delay stages, ones of said multiplying stages being connected to receive gain values from respective control lines; and an analog combining stage operatively connected to receive and combine outputs of said analog multiplying stages in a relation which implements a desired transversal filter function.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A cell structure for analog filters comprising:
    a differential amplifier stage inserted between a first reference supply voltage and a second reference voltage, said amplifier stage having at least one input terminal and at least one output terminal;
    wherein said amplifier stage comprises a pair of structurally identical half-cells, each provided with a transconductance amplifier stage and each having a differential output terminal connected through a respective capacitor to a common circuit node, each half cell comprising:
    a first transistor having a control terminal coupled to a differential input terminal of the amplifier stage, a first conduction terminal coupled to a high reference voltage source and a second conduction terminal, the first conduction terminal being unconnected to the other half cell;

a second transistor having a control terminal, a first conduction terminal coupled thereto so as to form a diode-connected transistor, and a second conduction terminal coupled to the second conduction terminal of the first transistor, the output terminal appearing at the first conduction terminal of the second transistor;

a first current source providing a current to the first conduction terminal of the second transistor; and a second current source sinking a current from the second terminal of the first and second transistors.

2. The cell structure for analog filters of claim 1 characterized in that each half-cell comprises at least one pair of bipolar transistors.

3. The cell structure for analog filters of claim 1 characterized in that each half-cell comprises at least one pair of field-effect transistors.

4. The cell structure of claim 1, wherein said amplifier stage has no negative feedback.

5. The cell structure of claim 1, wherein each half cell further comprises:

a third transistor having a control terminal coupled to the first conduction terminal of the first transistor, a first conduction terminal coupled to the first conduction terminal of the second transistor, and a second conduction terminal coupled to a second common circuit node; and a fourth transistor having a control terminal coupled to a bias voltage, a first conduction terminal coupled to the high reference voltage source and a second conduction terminal coupled to the first conduction terminal of the first transistor.

6. The cell structure of claim 1, further comprising:

an output stage connected in cascade relation to the amplifier stage, the output stage comprising a pair of structurally identical half output stages connected through a respective second capacitor to a second common circuit node, the output terminals of the amplifier stage provided to input terminals of the output stage.

7. The cell structure of claim 6, wherein each half output stage comprises a differential amplifier circuit.

8. A time-continuous analog delay line comprising:

a cascade of cells, each cell having a fully differential amplifier stage inserted between a first reference supply voltage and a second reference voltage, said amplifier stage having at least one input terminal and at least one output terminal;

wherein said amplifier stage comprises a pair of structurally identical half-cells, each provided with a transconductance amplifier stage and each connected through a respective capacitor to a common circuit node, each half cell comprising:

a first transistor having a control terminal coupled to a differential input terminal of the amplifier stage, a first conduction terminal coupled to a high reference voltage source and a second conduction terminal, the first conduction terminal being unconnected to the other half cell;

a second transistor having a control terminal, a first conduction terminal coupled thereto so as to form a diode-connected transistor, and a second conduction terminal coupled to the second conduction terminal of the first transistor, the output terminal appearing at the first conduction terminal of the second transistor;

a first current source providing a current to the first conduction terminal of the second transistor; and a second current source sinking a current from the second terminal of the first and second transistors.

9. The delay line of claim 8, wherein said amplifier stage has no negative feedback.

10. A transverse time-continuous analog filter comprising:

at least one delay line, said delay line comprising:

a cascade of cells, each cell having a fully differential amplifier stage inserted between a first reference supply voltage and a second reference voltage, said amplifier stage having at least one input terminal and at least one output terminal;

wherein said amplifier stage comprises a pair of structurally identical half-cells, each provided with a transconductance amplifier stage and each connected through a respective capacitor to a common circuit node, each half cell comprising:

a first transistor having a control terminal coupled to a differential input terminal of the amplifier stage, a first conduction terminal coupled to a high reference voltage source and a second conduction terminal, the first conduction terminal being unconnected to the other half cell;

a second transistor having a control terminal, a first conduction terminal coupled thereto so as to form a diode-connected transistor, and a second conduction terminal coupled to the second conduction terminal of the first transistor, the output terminal appearing at the first conduction terminal of the second transistor;

a first current source providing a current to the first conduction terminal of the second transistor; and a second current source sinking a current from the second terminal of the first and second transistors.

11. The filter of claim 10 comprising a cascade of identical delay lines connected through multiplier circuits to a final summation circuit.

12. The filter of claim 10, wherein said amplifier stage has no negative feedback.

13. An elementary cell structure for time-continuous analog filters an in particular for the processing of analog signals in read/write operations on magnetic supports, including a fully differential amplifier inserted between a first reference supply voltage and a second reference voltage and having at least one input terminal and at least one output terminal, said amplifier comprising an input stage coupled to said at least one input terminal and having a pair of structurally identical half stage input circuits coupled to a first common node through a respective first capacitor, and an output stage coupled to said at least one output terminal and having a pair of structurally identical half stage output circuits, said half stage output circuits being connected to a second common circuit node through a respective second capacitor, each of the half stage input circuits being connected in cascade relation to a respective half stage output circuit at an input thereof, each half stage input circuit comprising a first transistor having a control terminal coupled to said at least one input terminal, a first conduction terminal coupled to a high reference voltage source and a second conduction terminal, the first conduction terminal being unconnected to the other half stage input circuit, a second transistor having a control terminal, a first conduction terminal coupled thereto so as to form a diode-connected transistor, and a second conduction terminal coupled to the second conduction terminal of the first transistor, a first current source providing a current to the first conduction terminal of the second transistor, and a second current source sinking a current from the second terminal of the first and second transistors.

14. The cell structure of claim 13, wherein said amplifier stage has no negative feedback.

15. The elementary cell structure of claim 13, wherein each half stage output circuit comprises differential amplifier circuit.

16. A time-continuous integrated circuit filter structure, comprising:

a plurality of substantially identical fully differential analog transconductor delay cells which are mutually interconnected through respect capacitors along a signal path, each delay cell comprising:
an input stage comprising a pair of substantially structurally identical half input stages connected to a first common node through a respective first capacitor, each half input stage comprising:
a first transistor having a control terminal coupled to an input of the delay cell, a first conduction terminal coupled to a high reference voltage source and a second conduction terminal, the first conduction terminal being unconnected to the other hale input stage;
a second transistor having a control terminal, a first conduction terminal coupled thereto so as to form a diode-connected transistor, and a second conduction terminal coupled to the second conduction terminal of the first transistor, an output of the half input stage appearing at the first conduction terminal of the second transistor; and
a first current source sinking a current from the second terminal of the first and second transistors;
an output stage connected in cascade relation to the input stage and comprising a pair of substantially structurally identical half output stages connected to a second common node through a respective second capacitor; and
an analog combining stage operatively connected to receive and combine outputs of said delay cells in a circuit relation which implements a transversal filter function.

17. The integrated circuit of claim 16, wherein said analog combining stage is an analog summation stage.

18. The integrated circuit of claim 16, wherein said transconductor delay stages are connected in series to receive and pass along an external input signal.

19. The integrated circuit of claim 16, wherein said transconductor delay stages are interconnected in series with said respective multiplying stages and in parallel with each other.

20. The integrated circuit of claim 16, wherein each said transconductor delay stage contains an active device circuit configuration which is identical to that of others of said transconductor delay stages.

21. The integrated circuit of claim 16, wherein all said transconductor delay stages are identical.

22. The integrated circuit of claim 16, wherein said transconductor delay stages have identical circuit typology but include delay-determining capacitors of different respective values.

23. A time-continuous filter integrated circuit, comprising:

a plurality of transconductor delay stages which are all topologically similar to each other and which each include at least one capacitor, each delay stage comprising:
an input stage comprising a pair of substantially structurally identical half input stages connected to a first common node through a respective first capacitor, each half input stage comprising:
a first transistor having a control terminal coupled to an input of the delay cell, a first conduction terminal coupled to a high reference voltage source and a second conduction terminal, the first conduction terminal being unconnected to the other half input stage;
a second transistor having a control terminal, a first conduction terminal coupled thereto so as to form a diode-connected transistor, and a second conduction terminal coupled to the second conduction terminal of the first transistor, an output of the half input stage appearing at the first conduction terminal of the second transistor; and
a first current source sinking a current from the second terminal of the first and second transistors;
an output stage connected in cascade relation to the input stage and comprising a pair of substantially structurally identical half output stages connected to a second common node through a respective second capacitor;
a plurality of analog multiplying stages each connected to the output of a respective one of said transconductor delay stages, ones of said multiplying stages being connected to receive gain values from respective control lines; and
an analog combining stage operatively connected to receive and combine outputs of said analog multiplying stages in a relation which implements a desired transversal filter function.

24. The integrated filter circuit of claim 23, wherein said analog combining stage is an analog summation stage.

25. The integrated filter circuit of claim 23, wherein said transconductor delay stages are connected in series to receive and pass along an external input signal.

26. The integrated filter circuit of claim 23, wherein said transconductor delay stages are interconnected in a series-parallel relationship.

27. The integrated filter circuit of claim 23, wherein each said transconductor delay stage contains an active device circuit configuration which is identical to that of others of said transconductor delay stages.

28. The integrated filter circuit of claim 23, wherein all said transconductor delay stages are identical.

29. The integrated filter circuit of claim 23, wherein said transconductor delay stages have identical circuit typology but include delay-determining capacitors of different respective values.

* * * * *